United States Patent [19]

Thomas

[11] Patent Number: 4,661,375

[45] Date of Patent: Apr. 28, 1987

[54] METHOD FOR INCREASING THE HEIGHT OF SOLDER BUMPS

[75] Inventor: Donald A. Thomas, Hopewell Township, Mercer County, N.J.

[73] Assignee: AT&T Technologies, Inc., Berkeley Heights, N.J.

[21] Appl. No.: 838,187

[22] Filed: Mar. 7, 1986

Related U.S. Application Data

[63] Continuation of Ser. No. 725,707, Apr. 22, 1985, abandoned.

[51] Int. Cl.$^4$ .................... H01L 29/44; H01L 21/88
[52] U.S. Cl. ........................................ 427/89; 204/15; 427/90; 427/91; 427/96; 427/99; 427/433
[58] Field of Search .................... 427/89–91, 427/96, 99, 433; 204/15

[56] References Cited

U.S. PATENT DOCUMENTS

| | | | |
|---|---|---|---|
| 3,401,055 | 9/1968 | Langdon | 427/89 |
| 3,454,374 | 7/1969 | Domin | 427/89 |
| 3,479,736 | 12/1969 | Toki | 427/433 |
| 3,585,713 | 6/1971 | Kaneda | 427/90 |
| 3,809,625 | 5/1974 | Brown | 204/15 |
| 4,273,859 | 6/1981 | Mones et al. | 430/315 |
| 4,293,637 | 10/1981 | Hatada | 427/90 |
| 4,412,642 | 11/1983 | Fisher, Jr. | 228/173 R |
| 4,427,715 | 1/1984 | Harris | 427/89 |
| 4,451,972 | 6/1984 | Batinovich | 427/89 |
| 4,505,029 | 3/1985 | Owyang | 427/89 |
| 4,545,610 | 10/1985 | Lakritz | 29/591 |

OTHER PUBLICATIONS

Article entitled "Flip Chip Solder Terminals" by P. A. Totta in the 21st ECC (1971).
Article entitled "Flip Chip Bonding" by K. C. Chhabra et al., JIETE, May 1975.

Primary Examiner—John D. Smith
Attorney, Agent, or Firm—D. J. Kirk

[57] ABSTRACT

The height of solder bumps (10) on a bonding pad (24) of a semiconductor chip (12) is increased by successively immersing the chip in molten solder alloys having progressively lower melting points.

8 Claims, 2 Drawing Figures

METHOD FOR INCREASING THE HEIGHT OF SOLDER BUMPS

This is a continuation of application Ser. No. 725,707 filed Apr. 22, 1985, now abandoned.

TECHNICAL FIELD

The instant invention is directed to forming solder bumps on bonding pads of electronic devices. In particular, the invention is directed to techniques for increasing the height of such solder bumps.

BACKGROUND OF THE INVENTION

In fabricating certain electronic components (e.g., semiconductor chips or wafers) it is conventional to bond one end of a gold or aluminum wire to a metallized contact pad on a semiconductor chip and the other end of the wire to a corresponding metallized portion on a supporting substrate. Such a technique is normally accomplished by thermocompression or ultrasonic bonding. Although wire bonding is an effective method it requires two separate bonds and has a relatively high labor cost.

To overcome such problems it is known to form "solder bumps" on the metallized contact pads of the semiconductor chips which then may be placed in contact with the corresponding metallized portion of the substrate. The solder bump is then exposed to an elevated temperature to reflow the solder to form the bond. Such a technique is disclosed in U.S. Pat. No. 4,273,859 which issued on June 16, 1981 and is hereby incorporated by reference herein.

Advantageously, the solder bump approach provides a high level of hermeticity. In conjunction with the use of a passivation layer, reflowed solder terminals seal the bonding pads and provide an effective hermetic seal for the device. Additionally, these solder joints have been found to have high mechanical strength and are also quite ductile and are capable of absorbing stresses induced by thermal cycling. Because of the high strength and integrity of the resulting solder interconnections, device reliability has been reported to be higher than for wire-bonded interconnections.

It is desirable to deposit as much solder as possible on each bonding pad to provide good mechanical strength for the solder joint. It is also important to have solder bumps with a maximum height in order to provide as much distance as possible between the semiconductor chip on the substrate to which it is bonded. This space precludes shorts between the device and substrate and permits encapsulant to flow therebetween.

Deposition of solder using evaporation and electroplating techniques have been used to deposit large amounts of solder depending upon the amount of material evaporated or electroplated. Also, it is known to immerse the device in molten solder to form the bump. However, with immersion, the amount of solder deposited and hence the solder bump height appears to be limited by the bonding pad area wherein the larger bonding pad areas give rise to solder bumps of greater height. While solder immersion has been found to yield less than desirable bump heights, it is the least expensive method of deposition.

Accordingly, there is a need for a method of increasing the height of solder bumps formed when using solder immersion techniques.

SUMMARY OF THE INVENTION

The instant invention overcomes the foregoing problems with a method of increasing the height of a solder bump, comprising the steps of: sequentially applying a different molten solder alloy to the solder bump wherein each alloy has a lower melting temperature than the alloy previously applied.

Advantageously, this technique has resulted in substantial increase in the solder bump height associated with solder immersion of devices.

DETAILED DESCRIPTION

Figure 1:
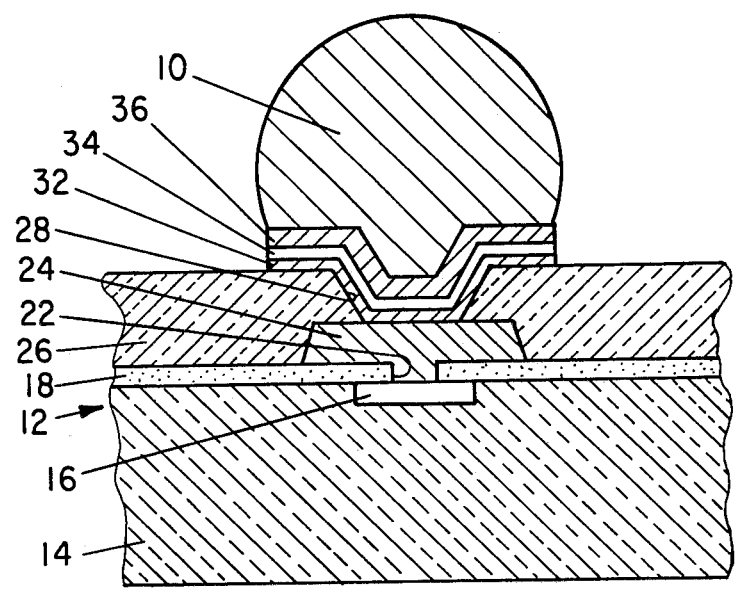
FIG. 1 is a partial cross-sectional view of a semiconductor device with a solder bump thereon.

FIG. 1 is a partial cross-sectional view of a solder bump 10 formed on a semiconductor chip 12. The semiconductor chip 12 is comprised of a silicon base 14 having a diffused region contact area 16 therein. An oxide layer 18 having an opening 22 is located on the surface of the silicon base 14. An aluminum bonding pad 24 contacts the area 16 and is surrounded by a passivation layer 26 having an opening 28 therein.

A contact metal layer 32, a diffusion barrier metal layer 34 and a solderable metal layer 36 are sequentially deposited on the exposed portion of the aluminum bonding pad 24. A solder bump 10 is then formed on the layer 36. It should be appreciated that the foregoing technique may be practiced on a single semiconductor chip or on a multitude of devices formed in a semiconductor wafer which may be particulated at a later time.

A solder alloy of 95% Pb/5% Sn is used almost universally for such solder bump 10 interconnections. Studies have shown this alloy to possess high creep resistance as well as resistance to thermal cycling fatigue. The mechanical integrity of the solder is critical, as the solder itself is the load-carrying member between the chip 12 and substrate. Any mismatch in thermal expansion between the chip 12 and a substrate (not shown) to which it is to be bonded must be taken up by the solder joint itself, and 95% Pb, 5% Sn solder has been found to be optimal for this application.

Because of the high melting point of 95/5 alloy ($T_m = 312°$ C.), secondary assembly operations can be accomplished using 60% Pb, 40% Sn solder ($T_m = 183°$ C.) without reflowing the 95/5 solder joints. For chips which go into dual-in-line packages, epoxy and silicone molding temperatures of 170° C. would not be expected to degrade 95/5 solder joints.

Along with the choice of the appropriate solder, of equal importance is the physical design of the solder joint. As the solder is a structural member, it is crucial to have sufficient solder in the joint to absorb thermally-induced stresses. A rule of thumb which is frequently used is to require the solder joint height to be greater than half the joint diameter. For devices with 4 mil by 6 mil bonding pads, solder joint heights of 4 mil are typically achieved. In general, larger solder joints provide better mechanical strength and thermal properties.

Another important consideration in solder joint design is keeping the chip 12 raised above the substrate surface. Should the solder joint be permitted to collapse, contact of the unprotected edges of the device with the substrate surface could electrically short out the device. Standoff is also necessary to permit encapsulant to flow under the chip 12 during packaging. Accordingly, it is important to have a solder bump 10 with a maximum of height.

Because the chips 12—12 are bonded face side down in most solder interconnection techniques ("flip-chip" bonding), a passivation layer 26 is generally required to protect the chip surface from scratches and other damage. A one-micron thick passivation layer 26 of silicon nitride is usually deposited over the top surface of the chip 12 for this purpose. Besides offering mechanical protection, the passivation layer 26 also protects the chip 12 from flux and solder. In addition, it acts as a barrier to prevent moisture penetration and the resulting corrosion of the underlying metallization. Together with the solder-bumped bonding pads 24—24, the passivation layer 26 is an integral part of providing hermeticity at the chip level.

The metal layers 32, 34 and 36 may be provided to enhance bondability and have the following characteristics: (1) The contact metal layer 32 is also known as the adhesion layer and its main function is to provide a base for the solder bump 10 which strongly adheres to the underlying bonding pad 24. The two most common contact metals used for devices with aluminum metallization are chromium and nickel. (2) The purpose of the diffusion barrier layer 34 is to prevent the diffusion of the solderable metal layer 36 to the underlying aluminum metallization of the pad 24. If diffusion were allowed to proceed, the growth of aluminum intermetallics could take place which would severely degrade the interconnections of the device. For most of the metallization schemes in use, the nickel or chromium contact metal layer 32 also functions as an effective diffusion barrier. (3) The function of the solderable metal layer 36 is to provide material that the solder will easily wet and interact with to form a strong metallic bond. The layer 36 is critical for good adhesion of the solder bump 10 and, if thick enough, permits the chip to withstand repeated soldering and resoldering reflow cycles. It is known to utilize a thick layer of copper (15 $\mu$m) to permit resoldering and act as a spacer to provide standoff for the chip above the substrate. While both nickel and copper are used for the solderable layer, copper is much more solderable than nickel and is preferred. Following deposition of the solderable metal layer, a thin layer of gold is frequently deposited to preserve its solderability.

After deposition of the base layers 32, 34 and 36, the solder bump 10 is deposited. While there are many techniques being used to fabricate solder bumps 10—10 on chips 12—12, most can be characterized by one of three deposition methods. These include (1) vacuum evaporation, (2) electroplating and (3) solder immersion. One of the main concerns of all techniques is depositing sufficient solder onto the bonding pads 16—16 to permit adequate standoff of the chip 12 above the substrate (not shown) and to accommodate all induced stresses in the solder joint.

The advantages of solder immersion techniques are that it is relatively inexpensive and greatly simplifies the chip 12 or semiconductor wafer (not shown) processing. Besides eliminating the photomasking operations involved in vacuum evaporation and electroplating, a solder reflow step is not required to spheridize the bumps 10—10. Semiconductor wafers or chips 12—12 with the underlying contact/diffusion barrier/solderable metal layers deposited are fluxed through an immersion or spray technique. The wafer or chips 12—12 are then either dipped into a molten solder pot or passed through a solder wave in a wave-soldering machine. Following soldering, the devices are cleaned to remove any flux residues.

One of the main limitations of this method is that the height of the bumps 12—12 is limited to under one mil on typical bonding pads 16—16 (4 mil $\times$ 6 mil) of the chips 12—12. Bump height is highly dependent on the area of the bonding pad 16; larger pads give rise to higher bumps.

Figure 2:
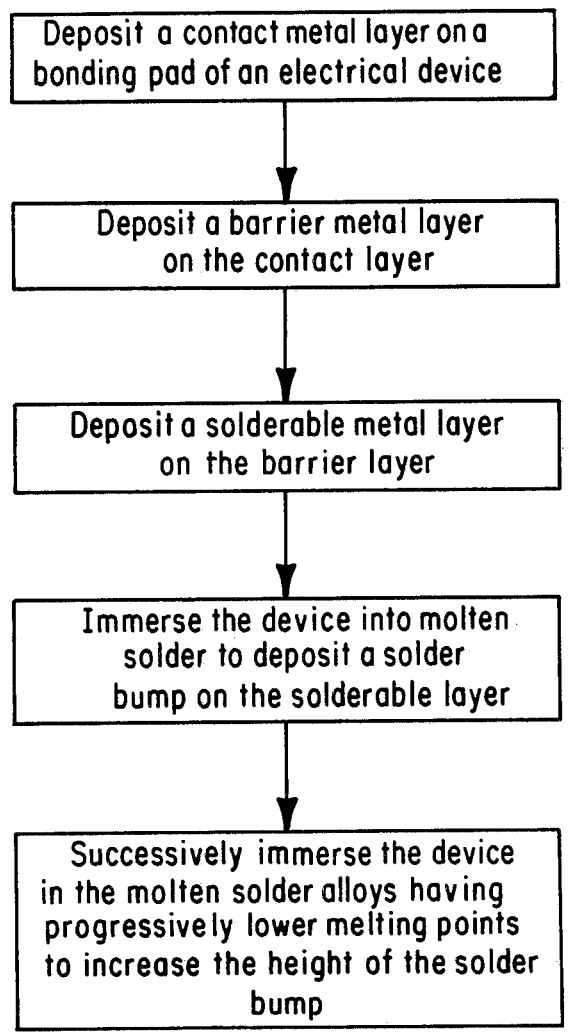
FIG. 2 is a block diagram depicting the steps of the instant method.

In order to increase the amount of solder deposited by immersion, the instant method uses successive applications of molten solder alloys (see FIG. 2), the alloys having progressively lower melting points, are made to the solder bump 10 to increase the height thereof to a predetermined value. The solder is deposited in successive layers without melting the previously deposited layers. Once all the layers have been deposited they are exposed to an elevated temperature sufficient to homogenize all the deposited alloys into a single alloy. Such a technique has resulted in an increase of 27% to 76% in the height of the solder bump 10 as a result of a second immersion.

To achieve an overall solder alloy of 95% Pb, 5% Sn the first deposit is an immersion in almost pure lead ($T_m = 327°$ C.) followed by an immersion in 95% Pb, 5% Sn ($T_m = 312°$ C.), followed by a final immersion in 90% Pb, 10% Sn ($T_m = 302°$ C.). Upon reflow of the solder bump at 327° C. a homogeneous alloy of 95% Pb, 5% Sn and a bump larger than that attainable with a single immersion into a 95% Pb, 5% Sn results.

It is to be understood that the embodiments described herein are merely illustrative of the invention. Various modifications may be made thereto by persons skilled in the art which embody the principles of the invention and fall within the spirit and scope thereof. For instance, a single nickel layer may, in some instances, be substituted for the metal layers 32, 34 and 36. Additionally, the bonding pad 24 may be eliminated and the nickel layer deposited directly on the silica base 14.

What is claimed is:

1. A method of increasing the height of a bump of solder alloy deposited on a substrate, comprising the steps of:
    sequentially applying a plurality of different molten solder alloys to the solder alloy bump wherein each alloy has a lower melting temperature than the alloy previously applied.

2. The method as set forth in claim 1 which comprises the further step of heating the solder bump with the sequentially applied alloys thereon to an elevated temperature to homogenize the deposited alloys.

3. A method of forming a solder bump on a bonding pad of an integrated circuit by sequentially applying at least two alloys thereon, comprising the steps of:
    (1) applying a passivation layer over the integrated circuit;
    (2) forming an aperture in the passivation layer to expose the bonding pad therethrough;
    (3) applying a metallic contact layer to the exposed bonding pad;
    (4) depositing a diffusion barrier layer over the contact layer;
    (5) applying a solderable metal layer to the barrier layer;
    (6) forming a bump of solder alloy on the solderable metal layer; and (7) sequentially applying at least one molten solder alloy, which is different than the previously applied alloys, to the solder bump wherein each alloy has a lower melting temperature than the alloy previously applied.

4. The method as set forth in claim 3, wherein:
depositing a gold layer on the solderable metal layer prior to forming a solder bump thereon.

5. The method as set forth in claim 3 wherein the solder bump is formed by vacuum evaporation.

6. The method as set forth in claim 3 wherein the solder bump is formed by electroplating.

7. The method as set forth in claim 3 wherein the solder bump is formed by solder immersion.

8. The method as set forth in claim 3 which comprises the further step of heating the solder bump with the sequentially applied alloys thereon to an elevated temperature to homogenize the deposited alloys.

* * * * *